(12) United States Patent
Hegarty

(10) Patent No.: US 9,093,900 B2
(45) Date of Patent: Jul. 28, 2015

(54) MEASURING CURRENT IN A POWER REGULATOR SYSTEM

(71) Applicant: TEXAS INSTRUMENTS INCORPORATED, Dallas, TX (US)

(72) Inventor: Timothy J. Hegarty, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/933,681

(22) Filed: Jul. 2, 2013

(65) Prior Publication Data

US 2014/0028272 A1    Jan. 30, 2014

Related U.S. Application Data

(60) Provisional application No. 61/694,139, filed on Aug. 28, 2012, provisional application No. 61/675,111, filed on Jul. 24, 2012, provisional application No. 61/821,539, filed on May 9, 2013.

(51) Int. Cl.

| | |
|---|---|
| *G05F 1/00* | (2006.01) |
| *H02M 3/158* | (2006.01) |
| *H01L 23/495* | (2006.01) |
| *H01L 23/00* | (2006.01) |
| *H02M 1/00* | (2007.01) |

(52) U.S. Cl.
CPC ......... *H02M 3/158* (2013.01); *H01L 23/49524* (2013.01); *H01L 23/49562* (2013.01); *H01L 23/49575* (2013.01); *H01L 24/37* (2013.01); *H01L 24/40* (2013.01); *H01L 24/41* (2013.01); *H01L 24/48* (2013.01); *H01L 2224/40247* (2013.01); *H01L 2224/4118* (2013.01); *H01L 2224/48247* (2013.01); *H01L 2224/73221* (2013.01); *H01L 2924/00014* (2013.01); *H01L 2924/1306* (2013.01); *H01L 2924/13091* (2013.01); *H01L 2924/30107* (2013.01); *H02M 2001/0009* (2013.01)

(58) Field of Classification Search
USPC ......... 323/271, 282, 283, 284, 285, 286, 311, 323/351
See application file for complete search history.

(56) References Cited

U.S. PATENT DOCUMENTS

| | | | |
|---|---|---|---|
| 8,222,879 B2 * | 7/2012 | Nguyen ......................... | 323/282 |
| 8,305,060 B2 * | 11/2012 | Hosokawa et al. ........... | 323/282 |
| 2007/0096710 A1 | 5/2007 | Nguyen et al. | |
| 2010/0327825 A1 | 12/2010 | Mehas et al. | |

(Continued)

OTHER PUBLICATIONS

PCT Search Report mailed Apr. 11, 2014.

*Primary Examiner* — Nguyen Tran
(74) *Attorney, Agent, or Firm* — William B. Kempler; Frank D. Cimino

(57) ABSTRACT

One embodiment includes a power regulator system. The system includes a gate driver circuit configured to generate switching signal and a switching circuit package configured to receive the switching signal at a gate terminal. A signal return associated with the switching signal is provided at a gate return terminal. The switching circuit package also includes a switch that is periodically activated in response to the switching signal to generate a switching voltage at a switching node terminal. A filter stage includes an inductor interconnecting the switching node terminal and a node. The inductor can be configured to conduct a current in response to the switching voltage to generate an output voltage. A current sense circuit interconnects the gate return terminal and the node and measures a magnitude of the output current.

19 Claims, 2 Drawing Sheets

(56) References Cited

U.S. PATENT DOCUMENTS

2011/0193543 A1 8/2011 Nguyen
2012/0019218 A1 1/2012 Fang et al.
2012/0139518 A1* 6/2012 Cleveland et al. ............ 323/283
2012/0161852 A1 6/2012 Curbelo et al.

* cited by examiner

MEASURING CURRENT IN A POWER
REGULATOR SYSTEM

CROSS-REFERENCE TO RELATED
APPLICATION

This application claims the benefit of U.S. Provisional Patent Application 61/694,139 filed on Aug. 28, 2012, entitled "LOSSLESS AND EFFICIENT CURRENT SENSING WITH VERTICAL STACKED POWER MOSFETS", and claims the benefit of U.S. Provisional Patent Application 61/675,111 filed on Jul. 24, 2012, entitled "LOSSLESS AND EFFICIENT CURRENT SENSING WITH VERTICAL STACKED POWER MOSFETS", and claims the benefit of U.S. Provisional Patent Application 61/821,539 filed on May 9, 2013, entitled "LOSSLESS AND EFFICIENT CURRENT SENSING WITH VERTICAL STACKED POWER MOSFETS", the entirety of each of the above-identified applications is incorporated by reference herein.

TECHNICAL FIELD

This disclosure relates generally to electronic circuit systems, and more specifically to measuring current in a power regulator system.

BACKGROUND

Power regulator systems can be implemented in a variety of electronic devices for regulating an output voltage to provide power to one or more circuit components in the electronic device. One such type of power regulator system is a switching power regulator, such as a buck converter, in which high-side and low-side switches are alternately activated to generate a switching voltage that provides an output current through an output inductor to generate an output voltage. Some power regulator systems implement current sensing to measure the magnitude of the output current, such as for feedback regulation, over-current protection, or to enable current reporting and telemetry. To meet increasing requirements for lower power dissipation and greater efficiency, current sensing is typically required to be performed in a substantially efficient manner.

SUMMARY

One embodiment includes a power regulator system. The system includes a gate driver circuit configured to generate switching signal and a switching circuit package configured to receive the switching signal at a gate terminal. A signal return associated with the switching signal is provided at a gate return terminal. The switching circuit package also includes a switch that is periodically activated in response to the switching signal to generate a switching voltage at a switching node terminal. A filter stage includes an inductor interconnecting the switching node terminal and a node. The inductor can be configured to conduct a current in response to the switching voltage to generate an output voltage. A current sense circuit interconnects the gate return terminal and the node and measures a magnitude of the output current.

Another embodiment includes a method for assembling a switching power regulator system. The method includes coupling high-side switching signal conductors to a top-gate terminal and a top-gate return terminal of a switching circuit package and coupling a low-side switching signal conductor to a bottom-gate terminal of the switching circuit package. The method also includes coupling an output stage inductor to a switching node terminal of the of the switching circuit package. The output stage can include an output inductor that interconnects the switching node terminal and an output node on which an output voltage is generated based on an output current through the output inductor. The method further includes coupling a current sense circuit to the top-gate return terminal of the switching circuit package and to the output node, the current sense circuit being configured to measure a magnitude of the output current.

Another embodiment includes a printed circuit board (PCB) that includes a gate driver circuit configured to generate a high-side switching signal and a low-side switching signal. The PCB also includes a switching circuit package configured to receive the low-side switching signal at a bottom-gate terminal, and to receive the high-side switching signal at a top-gate terminal and to provide a high-side signal return associated with the high-side switching signal at a top-gate return terminal. The switching circuit package can include a high-side switch and a low-side switch that are alternately activated in response to the high-side switching signal and the low-side switching signal, respectively, to generate a switching voltage at a switching node terminal. The switching node terminal and the top-gate return terminal can be interconnected by a conductor having a parasitic resistance. The PCB also includes an output stage comprising an output inductor that is configured to conduct an output current in response to the switching voltage to generate an output voltage at an output node. The PCB further includes a current sense circuit interconnecting the gate return terminal and the output node and being configured to measure a magnitude of the output current based on an effective resistance comprising a DC resistance of the output inductor and the parasitic resistance.

DETAILED DESCRIPTION

This disclosure relates generally to electronic circuit systems, and more specifically to measuring current in a power regulator system. A power regulator system, such as a buck regulator system, includes a gate driver configured to generate a high-side switching signal and a low-side switching signal. The power regulator system also includes a switching circuit package that can be implemented as an enclosed circuit package (e.g., a vertically-stacked metal-oxide semiconductor field-effect transistor (MOSFET) package) that can receive the high-side switching signal at a top-gate terminal and the low-side switching signal at a bottom-gate terminal. The switching circuit package can also provide a return signal associated with one of the high-side and low-side switching signals at a gate return terminal. For example, the gate return terminal can provide a high-side return signal for the high-side switching signal, such that the return gate terminal is a top-gate return terminal. The high-side and low-side switching signals can alternately activate a high-side and a low-side switch, respectively, in the switching circuit package for generating a switching voltage at a switching node terminal. The switching voltage can provide current flow through an inductor that is coupled to the switching node terminal for generating a voltage at a respective node (e.g., an input node or an output node depending on regulator topology).

A current sense circuit can be coupled to the gate return terminal and the respective node, and can be configured to measure a magnitude of the current. As an example, the gate return terminal and the switching node terminal can be separated by a conductor in the switching circuit package, the conductor having a parasitic resistance. Therefore, the parasitic resistance can be combined with a DC resistance of the inductor, such that the current can be measured based on an effective resistance that includes the DC resistance of the inductor and the parasitic resistance. As a result, the measurement of the current can have a substantially greater signal-to-noise ratio (SNR) and can be substantially more stable and have a substantially greater amplitude than existing current measuring techniques, including as described herein.

Figure 1:
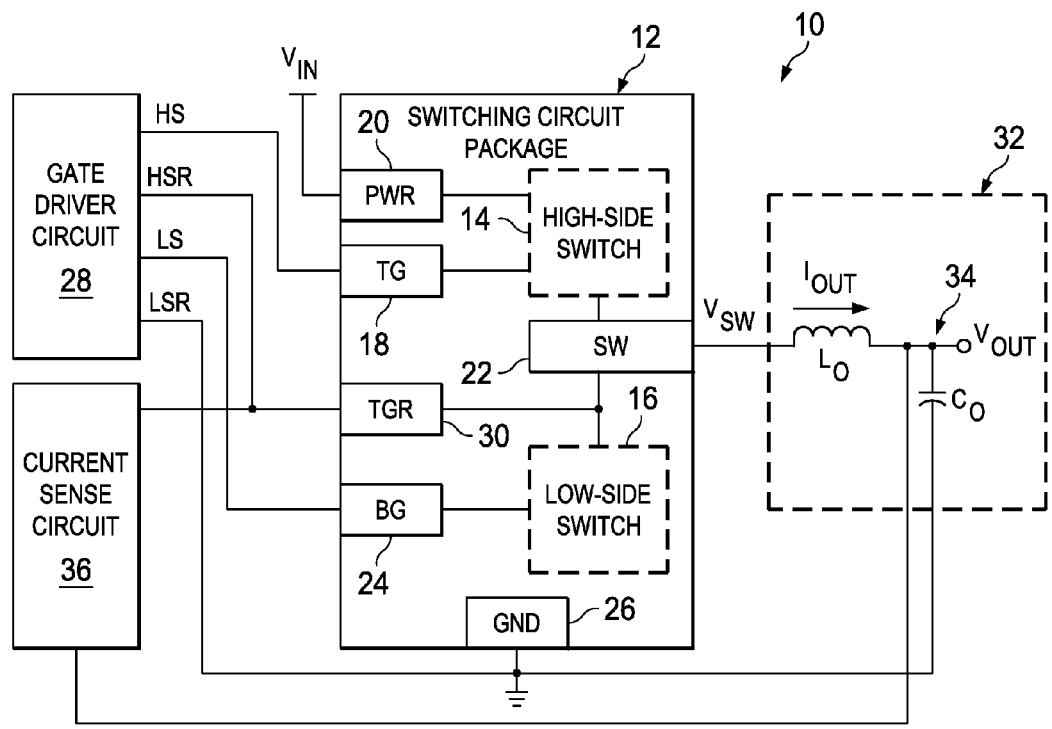
FIG. 1 illustrates an example of a power regulator system.

FIG. 1 illustrates an example of a power regulator system 10. The power regulator system 10 can be implemented in any of a variety of power providing applications, such as for computing devices, wireless communications devices, and/or battery charging devices. The power regulator system 10 can be implemented, for example, as a high-side and low-side DC buck power regulator that is configured to generate a DC output voltage $V_{OUT}$ based on a DC input voltage V. As an example, the input voltage $V_{IN}$ can have a substantially greater magnitude (e.g., 12 V) than the output voltage $V_{OUT}$ (e.g., 1.2 V). As an example, the power regulator system 10 can be implemented as regulator circuitry on a printed circuit board (PCB).

The power regulator system 10 includes a switching circuit package 12, such as can be implemented as an enclosed circuit package. As described herein, the term "enclosed circuit package" describes a standalone package having internal circuitry and having terminals that coupled the internal circuitry to external circuits. As described herein, the term "terminal", as described with respect to the switching circuit package 12, refers to a connection point for a conductor that is provided external to the switching circuit package 12 to couple to the circuitry within the switching circuit package 12. The switching circuit package 12 is demonstrated as including a high-side switch 14 and a low-side switch 16. The high-side switch 14 receives a high-side switching signal HS at a top-gate terminal (TG) 18, and interconnects a power terminal (PWR) 20 that receives the input voltage $V_{IN}$ and a switching node terminal (SW) 22. The low-side switch 16 receives a low-side switching signal LS at a bottom-gate terminal (BG) 24, and interconnects the switching node terminal 22 and a low-voltage rail terminal (GND) 26 that receives a low rail voltage, demonstrated in the example of FIG. 1 as ground. As an example, the terminals 18, 20, 22, 24, and 26 can be configured as any of a variety of different types of terminals, such as screw connections, solder pads, pins, or any other electrically-conductive connection type.

The switching node terminal 22 can include a conductor (e.g., copper) that interconnects the high-side switch 14 and the low-side switch 16, such as having a parasitic resistance. For example, the conductor can be integral with the switching node terminal 22. As described herein, the parasitic resistance includes the parasitic resistance of the conductor that is integral with the switching node terminal 22, and can also include a parasitic resistance of other connections associated with the switching circuit package 12, as well as parasitic resistance associated with traces on an associated PCB. As an example, the high-side switch 14 and the low-side switch 16 can be configured as vertically-stacked metal-oxide semiconductor field effect transistors (MOSFETs), such as N-channel power FETs. For example, the high-side switch 14 can be provided on a first semiconductor die in the switching circuit package 12 and the low-side switch 14 can be provided on a second semiconductor die in the switching circuit package 12, such that the first and second dies can be separated by the conductor that constitutes the switching node terminal 22.

The power regulator system 10 includes a gate driver circuit 28 configured to generate a high-side switching signal HS and a low-side switching signal LS that are alternately asserted based on a pulse-width modulation (PWM) duty-cycle. As an example, the PWM duty-cycle can include a dead-time between assertion of the high-side and low-side switching signals HS and LS. Thus, the high-side switching signal HS is asserted to activate the high-side switch 14 and the low-side switching signal LS is asserted to activate the low-side switch 16. In addition, the gate driver circuit 28 receives a high-side return signal HSR and a low-side return signal LSR from the switching circuit package 12. In the example of FIG. 1, the high-side return signal HSR is provided from a top-gate return terminal (TGR) 30, and the low-side return signal LSR is received from the low-voltage rail terminal 26. The top-gate return terminal 30 can be configured as any of a variety of electrically-conductive connection type (e.g., as described previously). The high-side return signal HSR can thus correspond to a level-shifted reference voltage for asserting the high-side switching signal HS at a voltage that is sufficient to activate the high-side switch 14 without damaging the high-side switch 14. As an example, the top-gate return terminal 30 can be configured as a Kelvin gate connection with respect to the high-side return signal HSR.

In response to the activation of the high-side and low-side switches 14 and 16 (e.g., via gate driver circuit 28), a switching voltage $V_{SW}$ can be generated at the switching node terminal 22. The power regulator system 10 includes a filter stage 32 that is coupled to the switching node terminal 22 and which includes an output inductor $L_O$ and an output capacitor $C_O$ that operate as an LC filter. The switching voltage $V_{SW}$ can provide an output current $I_{OUT}$ that flows through the output inductor $L_O$. For example, the high-side switch 14 is activated in response to the high-side activation signal HS to provide the output current $I_{OUT}$ from the input voltage $V_{IN}$ through the switching node terminal 22 and through the output inductor $L_O$, and the low-side switch 14 is activated in response to the low-side activation signal LS to provide the output current $I_{OUT}$ from ground through the switching node terminal 22 and through the output inductor $L_O$. Thus, the filter stage 32 can act as an output stage to provide an output voltage $V_{OUT}$ at an output node 34 in response to the output current $I_{OUT}$ flowing through the output inductor $L_O$.

The power regulator system 10 further includes a current sense circuit 36 that is configured to measure a magnitude of the output current $I_{OUT}$. As an example, the current sense circuit 36 can measure the magnitude of the output current $I_{OUT}$ for a variety of reasons, such as for regulation of the output voltage $V_{OUT}$ and/or for over-current protection. The current sense circuit 36 is demonstrated as interconnecting the top-gate return terminal 30 and the output node 34. As an example, the current sense circuit 36 can include a sense resistor and a sense capacitor that are series-connected, such that the sense capacitor can be configured to sample a voltage corresponding to the magnitude of the output current $I_{OUT}$ based on a DC resistance of the output inductor $L_O$.

The top-gate return terminal 30 can be coupled to a terminal of the low-side switch 16 (e.g., the drain of the low-side switch 16), and can thus be separated from the output inductor $L_O$ via the conductor that constitutes the switching node terminal 22. As a result, the current sense circuit 36 can measure the magnitude of the output current $I_{OUT}$ based on an effective resistance comprising the DC resistance of the output inductor $L_O$ and the parasitic resistance of the conductor of the switching node terminal 22. As an example, the parasitic resistance of the conductor of the switching node terminal 22 can be based on activation of the low-side switch 16 that results in the output current $I_{OUT}$ flowing from ground, and can thus be based on the PWM duty-cycle of the high-side and low-side activation signals HS and LS.

Based on incorporating the parasitic resistance of the switching node terminal 22 in the measurement of the output current $I_{OUT}$, a greater signal-to-noise ratio (SNR) can be achieved relative to typical measurement systems in existing power regulator systems. For instance, existing power regulator systems typically measure the output current by coupling the current sense circuit to a respective switching node terminal, and thus only measure the output current based on the DC resistance of the respective output inductor. Furthermore, the effective resistance comprising the DC resistance of the output inductor $L_O$ and the parasitic resistance of the conductor of the switching node terminal 22 is stable with respect to switching and predictable with respect to temperature (e.g., based on a predictable temperature coefficient), such that the current sense circuit 36 achieves the measurement of the output current $I_{OUT}$ in a temperature compensated manner. This is in contrast to current measurement in typical power regulator systems that measure the discontinuous current through one of the high-side and low-side switches, and are thus subject to variation in switch on-state resistance based on temperature and/or semiconductor process (e.g., $R_{DSON}$).

Figure 2:
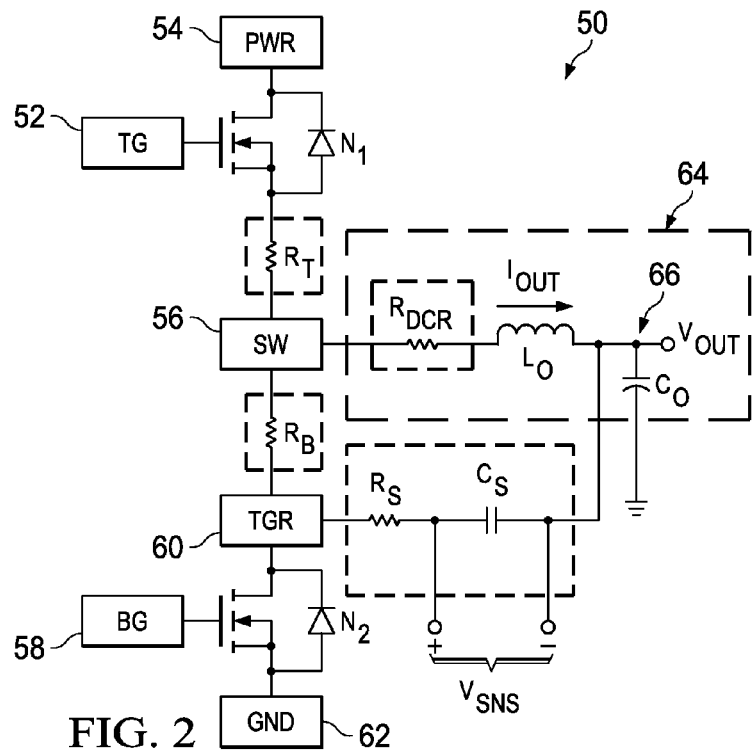
FIG. 2 illustrates an example of a power regulator circuit.

FIG. 2 illustrates an example of a power regulator circuit 50. The power regulator system 50 can be configured substantially similar to the power regulator system 10 in the example of FIG. 1. The power regulator circuit 50 includes a high-side switch $N_1$ and a low-side switch $N_2$ that are demonstrated in the example of FIG. 2 as N-channel power FETs. As an example, the high-side switch $N_1$ and the low-side switch $N_2$ can be provided in an enclosed circuit package, such as similar to the switching circuit package 12 in the example of FIG. 1.

The high-side switch $N_1$ has a gate that is coupled to a top-gate terminal (TG) 52, a drain that is coupled to a power terminal (PWR) 54, and a source that is coupled to a switching node terminal (SW) 56. As an example, the top-gate terminal 52 can receive a high-side switching signal HS to activate the high-side switch $N_1$, and the power terminal 54 can be coupled to an input voltage (e.g., the input voltage $V_{IN}$). The low-side switch $N_2$ has a gate that is coupled to a bottom-gate terminal (BG) 58, a drain that is coupled to a top-gate return terminal (TGR) 60, and a source that is coupled to a low-voltage rail terminal (GND) 62. As an example, the bottom-gate terminal 58 can receive a low-side switching signal (e.g., the low-side switching signal LS from a driver circuit) to activate the low-side switch $N_2$, the low-voltage rail terminal 62 can be coupled to a low-voltage rail (e.g., ground) and can provide a return for the low-side switching signal (e.g., the return signal HSR), and the top-gate return terminal 60 can provide a return for the high-side switching signal (e.g., the return signal LSR). The top-gate return terminal 60 can be coupled to the switching node terminal 56. In some examples, the top-gate return terminal 60 can be configured as a Kelvin gate connection with respect to the high-side return signal HSR. The power regulator circuit 50 also includes a filter stage 64 that includes an output inductor $L_O$ and an output capacitor $C_O$. An output current $I_{OUT}$ flows through the output inductor $L_O$ to generate a DC output voltage $V_{OUT}$ at an output node 66 based on the activation of the high-side and low-side switches $N_1$ and $N_2$, similar to as described previously in the example of FIG. 1.

In the example of the FIG. 2, the power regulator circuit 50 includes a resistor $R_T$ between the source of the high-side switch $N_1$ and the switching node terminal 56, a resistor $R_B$ between the drain of the low-side switch $N_2$, and a resistor $R_{DCR}$ between the output inductor $L_O$ and the switching node terminal 56. The resistors $R_T$ and $R_B$ are representative of the parasitic resistance of the conductor that is integral with the switching node terminal 56. For example, the conductor of the switching node terminal 56 can be provided as interconnecting the high-side switch $N_1$ and the low-side switch $N_2$, and the top-gate return terminal 60 can be coupled directly to the drain of the low-side switch $N_2$. The resistor $R_{DCR}$ can represent the DC resistance of the output inductor $L_O$.

The power regulator circuit 50 further includes a current sense circuit 68, which can be a portion of a current measuring circuit, that is configured to measure a magnitude of the output current $I_{OUT}$. The current sense circuit 68 includes a sense resistor $R_S$ and a sense capacitor $C_S$ coupled in series between the top-gate return terminal 60 and the output node 66. The current sense circuit 68 can thus be configured to measure the output current $I_{OUT}$ based on an effective resistance $R_{EFF}$ that is based on the parasitic resistance of the resistor $R_B$ and the resistance of the resistor $R_{DCR}$ as a result of the activation of the low-side switch $N_2$. Because the low-side switch $N_2$ usually conducts for a longer duration than the high-side switch $N_1$ for more efficient operation of the power regulator circuit 50 based on the PWM duty cycle (e.g., approximately 10% duty-cycle), the resistor $R_B$ can contribute a significant amount of resistance to the effective resistance $R_{EEF}$ of the measurement path and thus to the measurement of the output current $I_{OUT}$ to provide a significant SNR and signal amplitude. As an example, the effective resistance can be expressed as follows:

$$R_{EFF}=R_{DCR}+(1-D)*R_B \qquad \text{Equation 1}$$

Where:
$R_{DCR}$ is the DC resistance of the output inductor $L_O$;
D is a duty-cycle of the high-side switching signal $N_1$; and
$R_B$ is a resistance of the resistor $R_B$.

The sense capacitor $C_S$ and the sense resistor $R_S$ can be configured to operate as an RC filter that allows for time-averaged measurement of the output current $I_{OUT}$, despite the periodic activation of the low-side switch $N_2$, and thus the periodic contribution of the resistor $R_B$ to the effective resistance $R_{EEF}$. As an example, the sense resistor $R_S$ and the sense capacitor $C_S$ can have an RC time constant that is substantially matched to an LR time constant associated with the effective resistance and the output inductor $L_O$. For example, the matching of the time constants can be expressed as follows:

$$L_O/R_{EFF}=R_S*C_S \qquad \text{Equation 2}$$

Where:
$L_O$ is an inductance of the output inductor $L_O$;
$R_S$ is a resistance of the sense resistor; and
$C_S$ is a capacitance of the sense capacitor.
In response to the matching of the LR and RC time constants, the sense capacitor $C_S$ can sample a sense voltage $V_{sNs}$ that corresponds to the output current $I_{OUT}$. The output current $I_{OUT}$ can thus be measured based on the sense voltage $V_{SNS}$, such as follows:

$$I_{OUT}=V_{SNS}/R_{EFF} \qquad \text{Equation 3}$$

As described previously regarding the example of FIG. 1, based on incorporating the parasitic resistance $R_B$ of the switching node terminal 56 in the measurement of the output current $I_{OUT}$, a greater SNR and signal amplitude can be achieved rather than measurement of the $I_{OUT}$ based solely on the DC resistance $R_{DCR}$ of the output inductor $L_O$. For example, the DC resistance $R_{DCR}$ of the output inductor $L_O$ can be very low (e.g., about 0.2 mΩ). Therefore, if the current sense circuit 68 was coupled to the switching node terminal 56 instead of the top-gate return terminal 60, as provided in typical power regulator systems, the current sense circuit 68 would not include the portion of the conductor of the switching node terminal 56 that is provided between the high-side switch $N_1$ and the low-side switch $N_2$, and thus would not include the resistance $R_B$ in the effective resistance $R_{EFF}$. Therefore, for an output current $I_{OUT}$ of approximately 30 amps, the sense voltage $V_{SNS}$ can be only approximately 6 mV, which can result in a low SNR that can produce significant measurement error.

Additionally, because the measurement of the output current $I_{OUT}$ is based on the flow of the output current $I_{OUT}$ through the conductor (e.g., copper), which can be the same conductor with which the output inductor $L_O$ is manufactured, the measurement of the output current $I_{OUT}$ can be substantially temperature compensated, such that the effective resistance $R_{EFF}$ can be substantially stable and predictable based on variations in temperature. Accordingly, the measurement of the output current $I_{OUT}$ can be substantially accurate, as opposed to typical power regulator systems that measure the output current based on measuring current flow through the high-side switch and/or the low-side switch, which can exhibit unpredictable resistance based on temperature and/or activation timing (e.g., changes in $R_{DSON}$). Furthermore, the arrangement of the current sense circuit 68 with respect to the coupling to the top-gate return terminal 60 can be implemented without changes to commercially available switching circuit packages, such as including a return terminal (e.g., the top-gate return terminal 60). Accordingly, the approach disclosed herein enables accurate measurement of the output current $I_{OUT}$ in an inexpensive and efficient manner.

It is to be understood that the power regulator system 10 and the power regulator circuit 50 are not intended to be limited to the examples of FIGS. 1 and 2, respectively. For example, while the power regulator system 10 and the power regulator circuit 50 are demonstrated as buck converters, it is to be understood that the current sensing techniques, as well as the connections associated with the current sense circuit (e.g., the current sense circuit 36), can be applicable to other types of switching power regulators, both isolated and non-isolated topology variants, such as a boost power regulator system (e.g., in which the output node 34 and the input power terminal 20 are reversed). As another example, the high-side switch $N_1$ and the low-side switch $N_2$ are not limited to being implemented as N-channel FETs, but could be configured as any of a variety of different types of switches. As another example, the current sense circuit 68 is not limited to coupling to the top-gate return terminal 60, but could instead couple to another portion of the switching circuit package 12 to provide measurement of the output current $I_{OUT}$ through the conductor that is integral with the switching node terminal 56. For example, the current sense circuit 68 could instead be coupled to a separate gate return terminal, such as associated with the low-side switch $N_2$ (e.g., for a different configuration of switches). As another example, the effective resistance $R_{EFF}$ can include the resistor $R_T$ instead of or in addition to the resistor $R_B$. Therefore, the power regulator system 10 and the power regulator circuit 50 are not intended to be limited to the examples of FIGS. 1 and 2, respectively, can be configured in a variety of ways.

Figure 3:
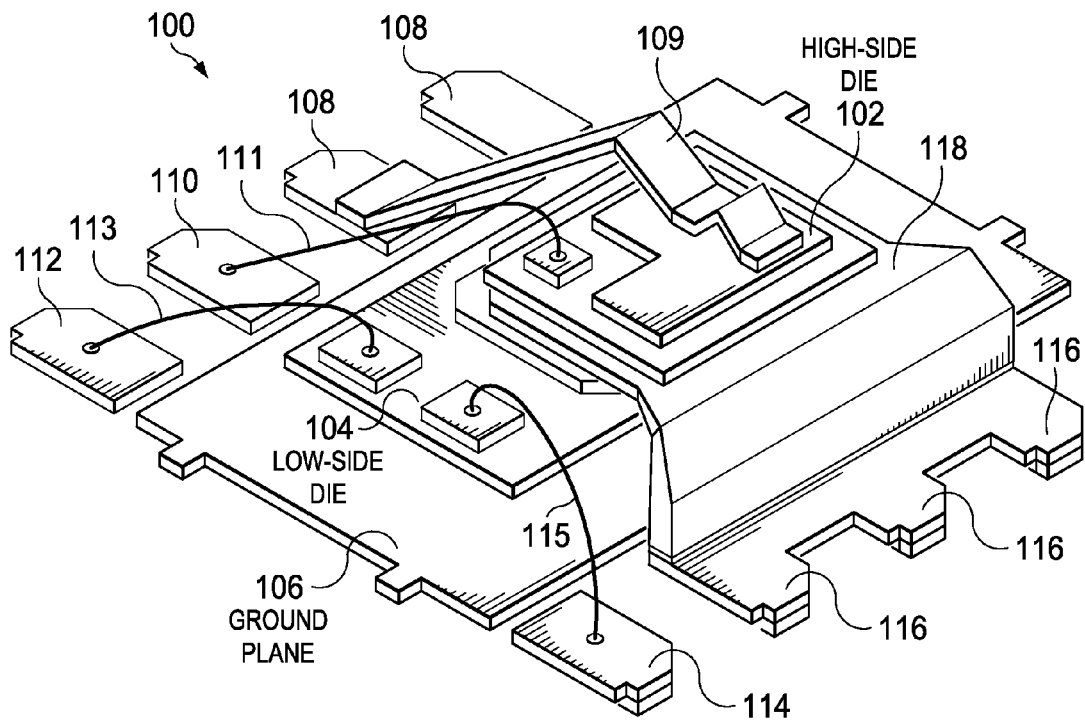
FIG. 3 illustrates an example of a switching circuit package.

FIG. 3 illustrates an example of a switching circuit package 100. The switching circuit package 100 can correspond to the switching circuit package 12 in the example of FIG. 1. In the example of FIG. 3, the switching circuit package 100 is demonstrated as a vertically-stacked switching circuit package 100. As an example, the switching circuit package 100 can include an enclosure (not shown in the example of FIG. 3) that encloses substantially all of the switching circuit package 100 except for the terminals described hereafter.

The switching circuit package 100 includes a high-side die 102 that includes a high-side switch and a low-side die 104 that includes a low-side switch. The low-side die 104 is arranged over a ground plane 106 that correspond to the low-voltage rail terminal 26. In the example of FIG. 3, the switching circuit package 100 also includes two power terminals 108 that can be configured to couple to an input voltage (e.g., the input voltage $V_{IN}$) and which are coupled to a drain of the high-side switch associated with the high-side die 102 via a conductor 109. The switching circuit package 100 also includes a top-gate terminal 110 that can be configured to receive the high-side switching signal HS and which is coupled to a gate of the high-side switch associated with the high-side die 102 via a conductor 111. The switching circuit package 100 also includes a top-gate return terminal 112 that can be configured to provide the high-side return signal HSR and which is coupled to a drain of the low-side switch associated with the low-side die 104 via a conductor 113. The switching circuit package 100 further includes a bottom-gate terminal 114 that can be configured to receive the low-side switching signal LS and which is coupled to a gate of the low-side switch associated with the low-side die 104 via a conductor 115, and three switching node terminals 116 that can be configured to couple with a filter stage (e.g., the filter stage 32). The switching node terminals 116 are demonstrated as integral with a conductor 118 that interconnects the high-side die 102 and the low-side die 104 (e.g., interconnects a source of the high-side switch and a drain of the low-side switch).

Similar to as described previously, a current sense circuit can be coupled to the top-gate return terminal 112 and to an output node (e.g., the output node 34). Therefore, the current sense circuit can be configured to measure the magnitude of the output current based on an effective resistance of the DC resistance of an associated output inductor and of a parasitic resistance of the conductor 118 that interconnects the high-side die 102 and the low-side die 104. Accordingly, the current sense circuit can provide a sense voltage (e.g., the sense voltage $V_{SNS}$) that has a higher SNR and higher amplitude than current sense circuits in a typical power regulator system, such as coupling to the switching node terminals 116, and thus only measuring the output current based on the DC resistance of the output inductor.

Figure 4:
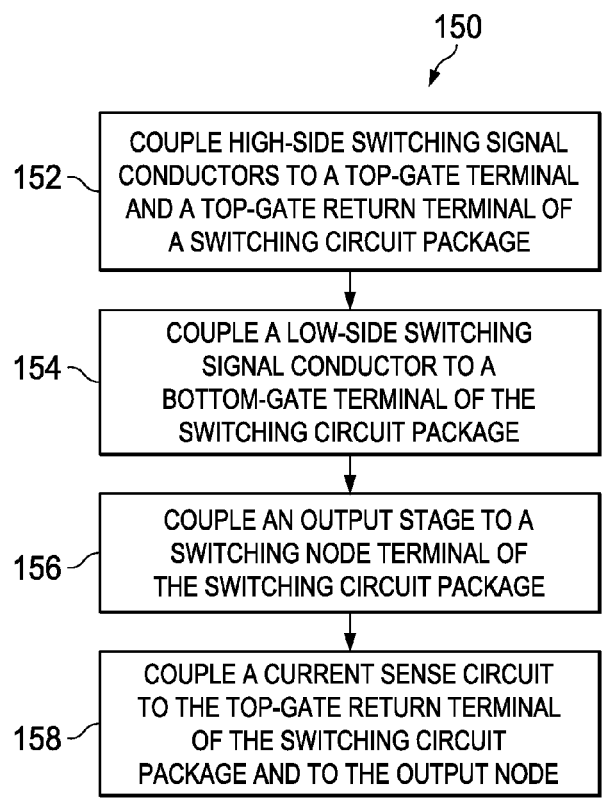
FIG. 4 illustrates an example of a method for assembling a switching power regulator system.

In view of the foregoing structural and functional features described above, certain methods will be better appreciated with reference to FIG. 4. It is to be understood and appreciated that the illustrated actions, in other embodiments, may occur in different orders and/or concurrently with other actions. Moreover, not all illustrated features may be required to implement a method.

FIG. 4 illustrates an example of a method 150 for assembling a switching power regulator system. At 152, high-side switching signal conductors (e.g., on which the high-side switching signal HS and the high-side return signal HSR are provided) are coupled to a top-gate terminal (e.g., the top-gate terminal 18) and a top-gate return terminal (e.g., the top-gate return terminal 30) of a switching circuit package (e.g., the switching circuit package 12). At 154, a low-side switching signal conductor (e.g., on which the low-side switching signal LS is provided) is coupled to a bottom-gate terminal (e.g., the bottom-gate terminal 24) of the switching circuit package. At 156, a filter stage (e.g., the filter stage 32) is coupled to a switching node terminal (e.g., the switching node terminal 22) of the switching circuit package. The filter stage can include an output inductor (e.g., the output inductor $L_O$) that interconnects the switching node terminal and an output node (e.g., the output node 34) on which an output voltage (e.g., the output voltage $V_{OUT}$) is generated based on an output current (e.g., the output current $I_{OUT}$) through the output inductor. At 158, a current sense circuit (e.g., the current sense circuit 36) is coupled to the top-gate return terminal of the switching circuit package and to the output node. The current sense circuit can be configured to measure a magnitude of the output current.

What have been described above are examples of the invention. It is, of course, not possible to describe every conceivable combination of components or method for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A power regulator system comprising:
   a gate driver circuit configured to generate switching signal;
   a switching circuit package configured to receive the switching signal at a gate terminal, and to provide a signal return associated with the switching signal at a separate gate return terminal providing a Kelvin gate drive connection, the switching circuit package comprising a switch that is periodically activated in response to the switching signal to generate a switching voltage at a switching node terminal;
   a filter stage comprising an inductor interconnecting the switching node terminal and another node, the inductor being configured to conduct a current in response to the switching voltage to generate an output voltage; and
   a current sense circuit interconnecting the gate return terminal and the other node and being configured to measure a magnitude of the current whereby a cumulative path resistance associated with parasitic resistance of the switching circuit package increases the voltage related to the current.

2. The system of claim 1, wherein the switching signal is configured as a low-side switching signal that is provided to a bottom-gate terminal, and wherein the gate return terminal is configured as a top-gate return terminal to provide a high-side return signal associated with a high-side switching signal that is provided to a top-gate terminal.

3. The system of claim 2, wherein the current sense circuit is configured to measure the magnitude of the current based on an effective resistance REFF expressed as:

$$R_{EFF} = R_{DCR} + (1-D) * R_B$$

Where:
   $R_{DCR}$ is a DC resistance of the inductor;
   D is a duty-cycle of the high-side switching signal; and
   $R_B$ is a parasitic resistance of a conductor interconnecting the top-gate return terminal and the switching node terminal.

4. The system of claim 1, wherein the switching circuit package comprises a high-side die associated with a high-side switch and a low-side die associated with the switch that is configured as a low-side switch, the high-side die and the low-side die being interconnected by a conductor that is integral with the switching node terminal, the conductor having a parasitic resistance.

5. The system of claim 4, wherein the gate return terminal is configured as a top-gate return terminal to provide a high-side return signal, the top-gate terminal being coupled to the low-side die at a first terminal of the low-side switch that is coupled to the switching node terminal via the conductor.

6. The system of claim 5, wherein the first terminal of the low-side switch is electrically coupled to a first terminal of the high-side switch via the conductor interconnecting the gate return terminal and the switching node terminal.

7. The system of claim 6, wherein the first terminal of the low-side switch corresponds to a drain of the low-side switch, and wherein the first terminal of the high-side switch corresponds to a source of the high-side switch.

8. The system of claim 1, wherein the switch is configured as a low-side switch, wherein the switching circuit package is configured as an enclosed circuit package comprising a high-side switch and the low-side switch, and wherein the high-side switch and the low-side switch are configured as vertically-stacked metal-oxide semiconductor field effect transistors (MOSFETs).

9. The system of claim 1, wherein the gate return terminal and the switching node terminal are electrically coupled via a conductor interconnecting the gate return terminal and the switching node terminal, the conductor having a parasitic resistance value.

10. The system of claim 9, wherein the current sense circuit comprises a sense resistor and a sense capacitor, an RC time constant of the sense resistor and the sense capacitor being substantially matched with an LR time constant comprising an inductance of the inductor and an effective combined resistance, the effective combined resistance comprising a DC resistance of the inductor and the parasitic resistance value of the conductor.

11. A printed circuit board (PCB) comprising the power regulator system of claim 1.

12. A method for a switching power regulator system, the method comprising:
   coupling high-side switching signal conductors to a top-gate terminal and a separate top-gate return terminal providing a Kelvin gate drive connection of a switching circuit package;
   coupling a low-side switching signal conductor to a bottom-gate terminal of the switching circuit package;
   coupling an output stage to a switching node terminal of the switching circuit package, the output stage comprising an output inductor that interconnects the switching node terminal and an output node on which an output voltage is generated based on an output current through the output inductor; and
   coupling a current sense circuit to the top-gate return terminal of the switching circuit package and to the output node, the current sense circuit being configured to measure a magnitude of the output current whereby a cumulative path resistance associated with parasitic resistance of the switching circuit package increases the voltage related to the current.

13. The method of claim 12, wherein the current sense circuit comprises a sense resistor and a sense capacitor.

14. The method of claim 13, further comprising matching an RC time constant of the sense resistor and the sense capacitor with an LR time constant comprising an inductance of the output inductor and an effective combined resistance, the effective combined resistance comprising a DC resistance of the output inductor and parasitic resistance of a conductor separating the switching node terminal and the top-gate return terminal.

15. The method of claim 12, wherein the switching circuit package is configured as an enclosed circuit package comprising a high-side switch and a low-side switch, and wherein the high-side switch and the low-side switch are configured as vertically-stacked metal-oxide semiconductor field effect transistors (MOSFETs).

16. The method of claim 12, wherein the switching circuit package comprises a high-side die and a low-side die that are interconnected by a conductor that is integral the switching node terminal, the conductor having a parasitic resistance value.

17. A printed circuit board (PCB) comprising:
a gate driver circuit configured to generate a high-side switching signal and a low-side switching signal;
a switching circuit package configured to receive the low-side switching signal at a bottom-gate terminal, and to receive the high-side switching signal at a top-gate terminal and to provide a high-side signal return associated with the high-side switching signal at a separate top-gate return terminal providing a Kelvin gate connection, the switching circuit package comprising a high-side switch and a low-side switch that are alternately activated in response to the high-side switching signal and the low-side switching signal, respectively, to generate a switching voltage at a switching node terminal, the top-gate return terminal being coupled to a conductor that has a parasitic resistance and is integral with the switching node terminal;
an output stage comprising an output inductor that is configured to conduct an output current in response to the switching voltage to generate an output voltage at an output node; and
a current sense circuit interconnecting the top-gate return terminal and the output node and being configured to measure a magnitude of the output current based on an effective resistance comprising a DC resistance of the output inductor and the parasitic resistance whereby a cumulative path resistance associated with parasitic resistance of the switching circuit package increases the voltage related to the current.

18. The system of claim 17, wherein the switching circuit package comprises a high-side die and a low-side die that are interconnected by the conductor.

19. The system of claim 17, wherein the switching circuit package is configured as an enclosed circuit package, and wherein the high-side switch and the low-side switch are configured as vertically-stacked metal-oxide semiconductor field effect transistors (MOSFETs).

* * * * *